(12) United States Patent
Liu et al.

(10) Patent No.: US 10,578,699 B2
(45) Date of Patent: Mar. 3, 2020

(54) SYSTEMS AND METHODS FOR FAT SUPPRESSION IN MAGNETIC RESONANCE IMAGING

(71) Applicant: SHANGHAI UNITED IMAGING HEALTHCARE CO., LTD., Shanghai (CN)

(72) Inventors: Liu Liu, Shanghai (CN); Aiguo Xue, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 88 days.

(21) Appl. No.: 15/798,147

(22) Filed: Oct. 30, 2017

(65) Prior Publication Data
US 2019/0025395 A1 Jan. 24, 2019

(30) Foreign Application Priority Data
Jul. 18, 2017 (CN) .......................... 2017 1 0588221

(51) Int. Cl.
*G01V 3/00* (2006.01)
*G01R 33/56* (2006.01)
*G01R 33/565* (2006.01)

(52) U.S. Cl.
CPC ...... *G01R 33/5607* (2013.01); *G01R 33/5659* (2013.01)

(58) Field of Classification Search
CPC ............. G01R 33/543; G01R 33/5659; G01R 33/3415; G01R 33/36; A61B 5/055
(Continued)

(56) References Cited

U.S. PATENT DOCUMENTS 8,040,134 B2 * 10/2011 Abe ................... G01R 33/4828
324/307
8,174,263 B2   5/2012 Abe et al.
(Continued)

FOREIGN PATENT DOCUMENTS

| CN | 106466182 A | 3/2017 |
| CN | 106952261 A | 7/2017 |
| CN | 107369153 A | 11/2017 |

OTHER PUBLICATIONS

International Search Report in PCT/CN2017/114102 dated Apr. 20, 2018, 4 pages.
(Continued)

*Primary Examiner* — Walter L Lindsay, Jr.
*Assistant Examiner* — Frederick Wenderoth
(74) *Attorney, Agent, or Firm* — Metis IP LLC

(57) ABSTRACT

A system includes a storage device storing a set of instructions and a processor in communication with the storage device. When executing the instructions, the processor is configured to cause the system to obtain one or more scanning parameters. The processor is also configured to cause the system to determine a first flip angle of a first fat suppression RF pulse and a second flip angle of a second fat suppression RF pulse. The processor is further configured to cause the system to scan a subject by applying an RF pulse sequence including the first fat suppression RF pulse, the second fat suppression RF pulse, and an excitation RF pulse. The processor is also configured to cause the system to receive magnetic resonance signals based on the scanning of the subject and reconstructing an image of the subject based on the MR signals.

17 Claims, 11 Drawing Sheets

(58) Field of Classification Search
USPC .......................................................... 324/309
See application file for complete search history.

(56) References Cited

U.S. PATENT DOCUMENTS

| | | | |
|---|---|---|---|
| 2009/0027051 A1* | 1/2009 | Stuber ................. | G01R 33/4828 |
| | | | 324/309 |
| 2009/0091324 A1* | 4/2009 | Sugiura .............. | G01R 33/4828 |
| | | | 324/309 |
| 2011/0210733 A1 | 9/2011 | Wheaton et al. | |
| 2011/0267060 A1 | 11/2011 | Abe et al. | |
| 2014/0177803 A1* | 6/2014 | Stevens ................... | A61B 6/52 |
| | | | 378/98 |
| 2015/0115960 A1 | 4/2015 | Grodzki | |
| 2015/0369892 A1* | 12/2015 | Yang .................. | G01R 33/4833 |
| | | | 324/309 |

OTHER PUBLICATIONS

Written opinion in PCT/CN2017/114102 dated Apr. 20, 2018, 4 pages.
Extended European search report in European Application No. 17204652.6 dated Jul. 2, 2018, 10 pages.
Daniel Rosenfeld et al., Design of Adiabatic Pulses for Fat-Suppression Using Analytic Solutions of the Bloch Equation, Magnetic Resonance in Medicine,1997, 37(5):793-801.

* cited by examiner

SYSTEMS AND METHODS FOR FAT SUPPRESSION IN MAGNETIC RESONANCE IMAGING

CROSS-REFERENCE TO RELATED APPLICATIONS

The application claims priority of Chinese Patent Application NO. 201710588221.9, filed Jul. 18, 2017, the entire contents of which are hereby incorporated by reference.

TECHNICAL FIELD

The present disclosure generally relates to magnetic resonance imaging (MRI), and more particularly, to systems and methods for fat suppression in MRI.

BACKGROUND

Fat suppression is commonly used to suppress fat signals in MRI. For example, a fat suppression radio frequency (RF) pulse may be applied to a subject (or a portion thereof) before an MRI excitation RF pulse to suppress fat signals. However, the fat suppression RF pulse is sensitive to the inhomogeneity of the RF field (also be referred to as the B1 inhomogeneity for brevity), which may affect the effectiveness of fat suppression. Thus, it may be desirable to develop a fat suppression technique to reduce the effect of the B1 inhomogeneity, and thereby improving the imaging quality.

SUMMARY

According to an aspect of the present disclosure, a system may include an MRI scanner, a storage device configured to store a set of instructions, and at least one processor configured to communicate with the storage device. When executing the set of instructions, the at least one processor may be configured to direct the system to obtain one or more scanning parameters, and determine a first flip angle of a first fat suppression RF pulse and a second flip angle of a second fat suppression RF pulse based on the one or more scanning parameters. The at least one processor may also be configured to direct the system to scan a subject by applying an RF pulse sequence. The RF pulse sequence may include the first fat suppression RF pulse having the first flip angle, the second fat suppression RF pulse having the second flip angle, and an excitation RF pulse. The at least one processor may further be configured to direct the system to receive magnetic resonance (MR) signals based on the scanning of the subject, and reconstruct an image of the subject based on the MR signals.

In some embodiments, the at least one processor may also be configured to direct the system to determine a reference flip angle of a reference fat suppression RF pulse based on the one or more scanning parameters and determine the first flip angle and the second flip angle based on the reference flip angle.

In some embodiments, the at least one processor may also be configured to direct the system to determine a relationship between first flip angles of a plurality of first fat suppression RF pulses and second flip angles of a plurality of second fact suppression RF pulses based on the reference flip angle of the reference fat suppression RF pulse. The at least one processor may also be configured to direct the system to determine the first flip angle and the second flip angle.

In some embodiments, the at least one processor may also be configured to direct the system to determine a plurality of sets of flip angles based on the relationship between first flip angles of a plurality of first fat suppression RF pulses and second flip angles of a plurality of second fact suppression RF pulses. Each of the plurality of set of flip angles may include a candidate first flip angle and a candidate second flip angle. The at least one processor may further be configured to direct the system to select a set of flip angles that are least sensitive to RF field inhomogeneity among the plurality of sets of flip angles. The at least one processor may further be configured to direct the system to designated the candidate first flip angle of the selected set as the first flip angle of the first fat suppression RF pulse, and designate the candidate second flip angle of the selected set as the second flip angle of the second fat suppression RF pulse.

In some embodiments, the at least one processor may also be configured to direct the system to save a relationship between the determined first flip angle, the determined second flip angle, and a corresponding reference flip angle to the storage device.

In some embodiments, the at least one processor may also be configured to direct the system to obtain a relationship between first flip angles of a plurality of first fat suppression RF pulses and second flip angles of a plurality of second fact suppression RF pulses from the storage device. The at least one processor may further be configured to direct the system to determine the first flip angle of the first fat suppression RF pulse and the second flip angle of the second fat suppression RF pulse based on the obtained relationship.

In some embodiments, the at least one processor may further be configured to direct the system to apply a first dephasing gradient after the first fat suppression RF pulse.

In some embodiments, the at least one processor may further be configured to direct the system to apply a second dephasing gradient after the second fat suppression RF pulse.

In some embodiments, the one or more scanning parameters may include at least one of a repetition time of the reference fat suppression RF pulse, a time interval between a peak of the reference fat suppression RF pulse and a peak of the excitation RF pulse, the amount of residual fat, or a longitudinal recovery time of fat.

According to an aspect of the present disclosure, a method implemented on a computing device having one or more processors and a storage media is provided. The method may include one or more of the following operations. One or more scanning parameters may be obtained. A first flip angle of a first fat suppression RF pulse and a second flip angle of a second fat suppression RF pulse may be determined based on the one or more scanning parameters. A subject may be scanned by applying an RF pulse sequence. The RF pulse sequence may include the first fat suppression RF pulse having the first flip angle, the second fat suppression RF pulse having the second flip angle, and an excitation RF pulse. Magnetic resonance (MR) signals may be received based on the scanning of the subject. An image of the subject may be reconstructed based on the MR signals.

According to yet another aspect of the present disclosure, a non-transitory computer-readable storage medium storing instructions that, when executed by at least one processor of a system, cause the system to perform a method. The method may include obtaining one or more scanning parameters, and determining a first flip angle of a first fat suppression RF pulse and a second flip angle of a second fat suppression RF pulse based on the one or more scanning parameters. The method may also include scanning, by a MRI scanner, a subject by applying an RF pulse sequence. The RF pulse sequence may include the first fat suppression RF pulse having the first flip angle, the second fat suppression RF pulse having the second flip angle, and an excitation pulse. The method may further include receiving, by the MRI scanner, MR signals based on the scanning of the subject, and reconstructing an image of the subject based on the MR signals.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals similar structures throughout the several views of the drawings, and wherein.

DETAILED DESCRIPTION

Figure 1:
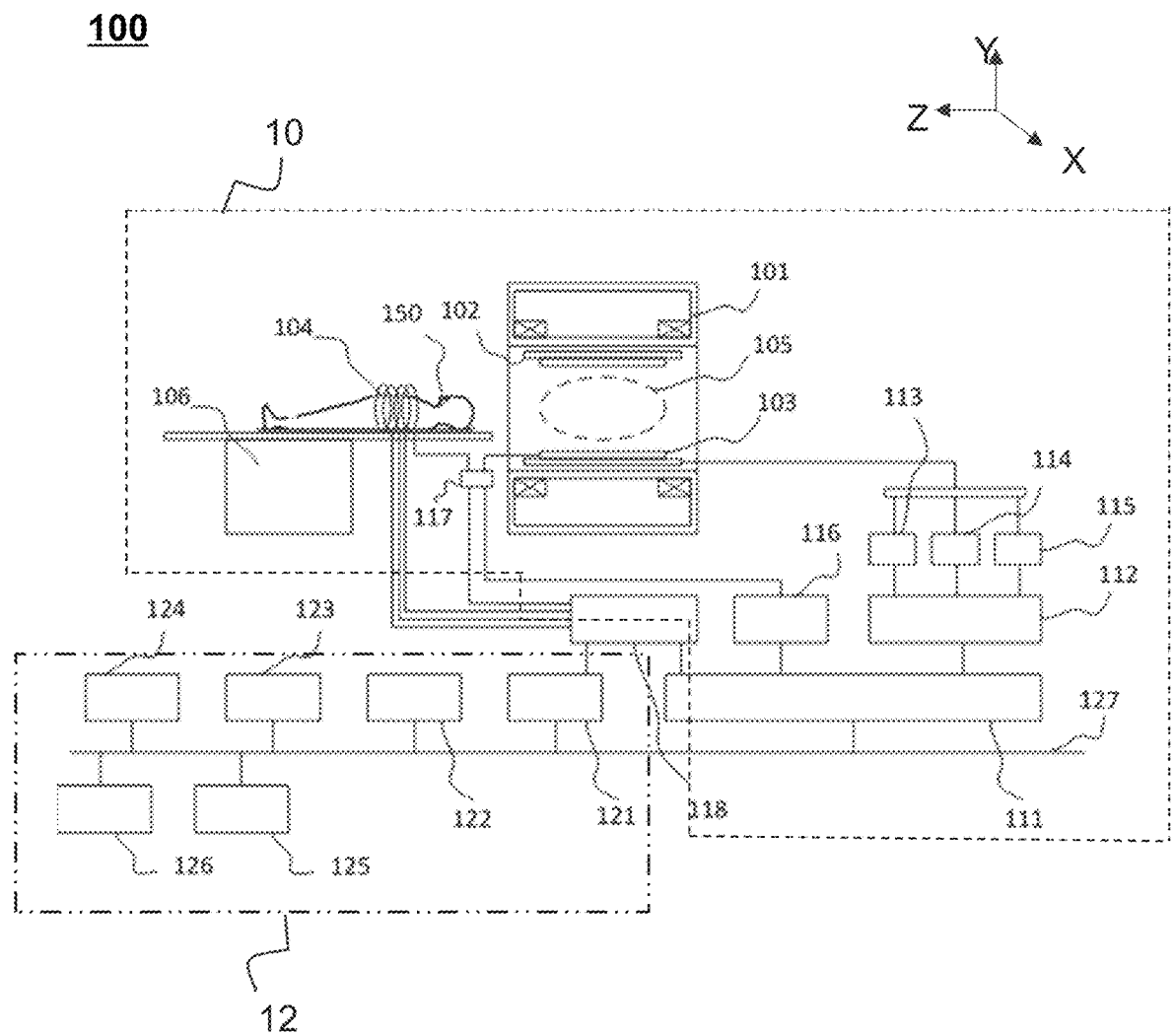
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is to describe particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, section or assembly of different level in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or themselves, and/or may be invoked in response to detected events or interrupts. Software modules/units/blocks configured for execution on computing devices (e.g., the processor 122 illustrated in FIG. 1) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may apply to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

An aspect of the present disclosure relates to systems and methods for reconstructing an MR image. The systems may perform the methods to obtain one or more scanning parameters, and determine a reference flip angle of a reference fat suppression RF pulse based on the one or more scanning parameters. The systems may also perform the methods to determine flip angles of a combined fat suppression RF pulse, which may include a first fat suppression RF pulse and a second fat suppression RF pulse, based on the reference flip angle. The systems may further perform the methods may scan a subject by applying an RF pulse sequence to receive MR signals related to the subject. The RF pulse sequence may include the combined fat suppression RF pulse and an excitation RF pulse. The systems may further perform the methods may reconstruct an image of the subject based on the MR signals. In some embodiments, the systems and methods described in the present disclosure may be primarily applied in frequency-selective fat saturation techniques.

FIG. 1 is a schematic diagram illustrating an exemplary MRI system 100 according to some embodiments of the present disclosure. The MRI system 100 may include an MRI scanner 10 and a computing device 12. The MRI scanner 10 and the computing device 12 may be connected to or communicated with each other. For example, the MRI scanner 10 and the computing device 12 may be connected to each other via a wired connection, a wireless connection, any other communication connection that can enable data transmission and/or reception, and/or any combination of these connections.

The MRI scanner 10 may be configured to scan a subject 150 to acquire MR data (e.g., MR signals) related to the subject 150. The MRI scanner 10 may include a gantry (not shown), a table 106, a main magnet (not shown), an RF coil (not shown), a gradient coil 102, a control unit 111, a gradient generator 112, an RF pulse generator 116, a switch 117, an RF pulse receiver 118, and a reconstruction unit 121. In some embodiments, the subject 150 may be a phantom, a patient, an organ, tissue, or any body parts of a patient to be scanned.

The gantry may be configured to support one or more components of the MRI scanner 10, such as the main magnet, the RF coil, and the gradient coil 102. The subject 150 may be placed on the table 106 for scanning. During an MR scanning, the subject 150 may lie on the table 106 along the Z-axis as illustrated in FIG. 1. The Z-axis may be the axial direction of the gantry. The X-axis may be perpendicular to the Z-axis, and the Y-axis may be perpendicular to the X-axis and the Z-axis.

The main magnet may generate a static main magnetic field. The main magnet may be of various types including, for example, a permanent magnet, a superconducting electromagnet, a resistive electromagnet, etc. The main magnet may have any magnetic field intensity, for example, 0.2 T, 0.5 T, 1.0 T, 1.5 T, 3.0 T. In some embodiments, the subject 150 may be positioned to an area 105 via the table 106 for scanning. The area 105 may be an area where the main magnetic field is homogeneously (or substantially homogeneously) distributed.

The control unit 111 may be configured to control one or more components in the MRI scanner 10. For example, the control unit 111 may control the RF pulse generator 116 to generate one or more RF pulses. The RF pulses may be amplified by an RF amplifier, and the amplified RF pulses may be transmitted by the RF coil toward the subject 150. The switch 117 may be configured to control the RF coil. The RF coil may include a body coil 103 and a local coil 104. The body coil 103 and/or the local coil 104 may transmit the RF pulses (or the amplified RF pulses) toward the subject 150. The body coil 103 and/or the local coil 104 may also receive MR signals caused by magnetic resonance phenomenon. In some embodiments, the MR signals may be received by the RF pulse receiver 118 and be further transmitted to the reconstruction unit 121 for image reconstruction.

The gradient coil 102 may generate magnetic field gradients to the main magnetic field to encode the spatial information of the subject 150. In some embodiments, the control unit 111 may control the gradient generator 112 to generate gradient signals. The gradient signals may be amplified by one or more gradient amplifiers. The gradient coil 102 may transmit magnetic field gradients based on the gradient signals (or the amplified gradient signals) toward the subject 150. For example, the gradient signals generated by the gradient generator 112 may be amplified by an X gradient amplifier 113, a Y gradient amplifier 114, and/or a Z gradient amplifier 115. The gradient coil 102 may transmit magnetic field gradients based on the amplified gradient signals toward the area 105 along the X-axis, the Y-axis, and/or the Z-axis.

The computing device 12 may be configured to execute instructions stored in a storage device (a storage device 125 or a storage module 240) to perform exemplary methods described in the present disclosure. In some embodiments, the computing device 12 may include a processor 122, a display 123, an input/output (I/O) 124, a storage device 125, and a communication port 126.

The processor 122 may execute computer instructions (e.g., program code) and, when executing the instructions, cause the computing device 12 to perform functions in accordance with techniques described herein. The computer instructions may include, for example, routines, programs, objects, components, data structures, procedures, modules, and functions, which perform particular functions described herein. For example, the processor 122 may determine flip angles of one or more fat suppression RF pulses configured to suppress fat signals in MRI. In some embodiments, the processor 122 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

The display 123 may be configured to display information (e.g., an MR image). The display 123 may include a liquid crystal display (LCD), a light emitting diode (LED)-based display, or any other flat panel display, or may use a cathode ray tube (CRT), a touch screen, or the like.

The I/O 124 may input and/or output signals, data, information, etc. In some embodiments, the I/O 124 may allow a user interaction with the computing device 12. In some embodiments, the I/O 124 may include an input device and an output device. Examples of the input device may include a keyboard, a mouse, a touch screen, a control box, a microphone, or the like, or a combination thereof. Examples of the output device may include a display device, a loudspeaker, a printer, a projector, or the like, or a combination thereof.

The storage device 125 may store data, instructions, and/or any other information. In some embodiments, the storage device 125 may store data and/or instructions that the computing device 12 may execute or use to perform exemplary methods described in the present disclosure. In some embodiments, the storage device 125 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random-access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 125 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The communication port 126 may be connected to a network to facilitate data communications. The communication port 126 may establish connections between one or more components of the MRI system 100, such as the control unit 111, the reconstruction unit 121 and the processor 122, the display 123, the I/O 124, and the storage device 125. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or a combination thereof. In some embodiments, the communication port 126 may be and/or include a standardized communication port, such as RS232, RS485, etc. In some embodiments, the communication port 126 may be a specially designed communication port. For example, the communication port 126 may be designed in accordance with the digital imaging and communications in medicine (DICOM) protocol.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. For example, the I/O 124, the display 123, the storage device 125 may be integrated into an MRI console (not shown). As another example, the MRI system 100 may further include a terminal. A user may control the operation of one or more components of the MRI system 100 (e.g., the MRI scanner 10) via the terminal. However, those variations and modifications do not depart the scope of the present disclosure.

Figure 2:
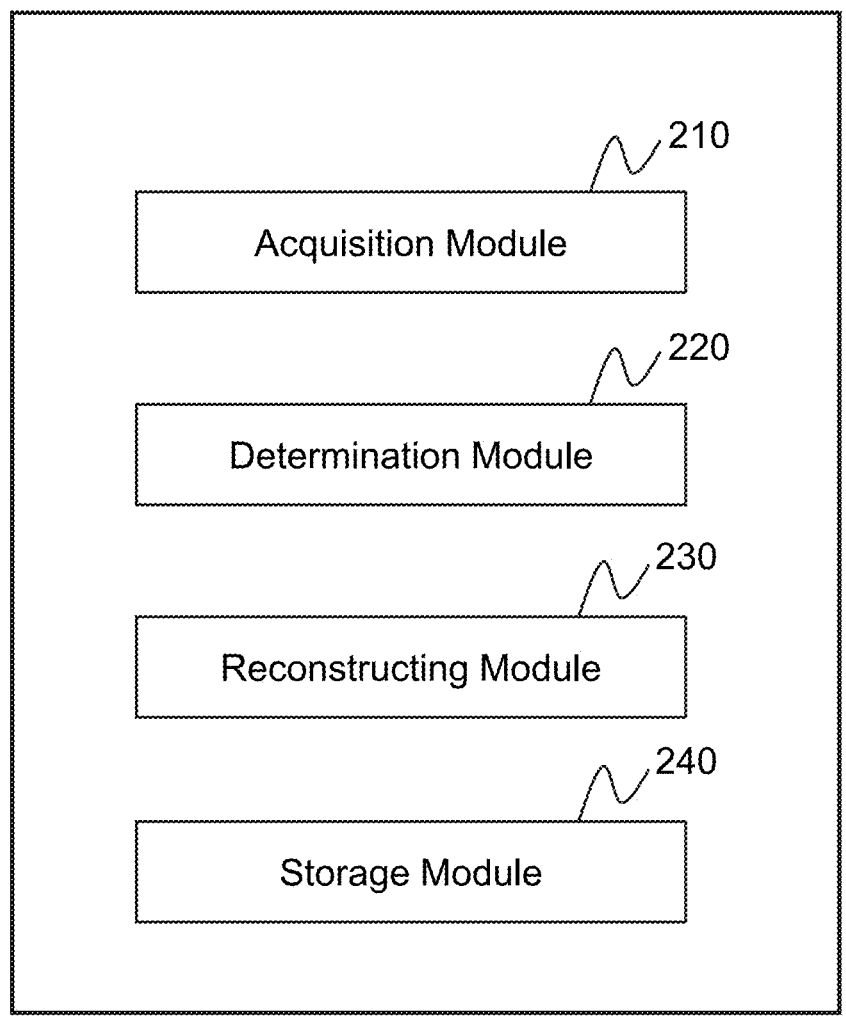
FIG. 2 is a block diagram illustrating an exemplary processor according to some embodiments of the present disclosure.

FIG. 2 is a block diagram illustrating a processor 122 according to some embodiments of the present disclosure. The processor 122 may include an acquisition module 210, a determination module 220, a reconstruction module 230, and a storage module 240.

The acquisition module 210 may acquire information. For example, the acquisition module 210 may obtain one or more scanning parameters. In some embodiments, the one or more scanning parameters may be related to a reference fat suppression RF pulse. Exemplary scanning parameters may include a repetition time of the reference fat suppression RF pulse, a longitudinal recovery time of fat, the amount of residual fat, a time interval between a peak of the reference fat suppression RF pulse and a peak of an excitation RF pulse, or the like, or any combination thereof. The acquisition module 210 may obtain the scanning parameters from an external source and/or one or more components of the MRI system 100, such as the MRI scanner 10, the storage device 125, and/or the storage module 240.

The determination module 220 may determine a flip angle of a fat suppression RF pulse. For example, the determination module 220 may determine a reference flip angle of a reference fat suppression RF pulse based on one or more scanning parameters. As another example, the determination module 220 may determine a first flip angle of a first fat suppression RF pulse and a second flip angle of a second fat suppression RF pulse based on one or more scanning parameters or a flip angle of a reference flip angle. Details regarding the determination of the first flip angle and the second flip angle may be found elsewhere in the present disclosure (e.g., FIG. 3 and the relevant descriptions thereof).

The reconstruction module 230 may be configured to reconstruct an image based on MR signals. In some embodiments, the reconstruction module 230 may reconstruct the image according to an image reconstruction algorithm. Exemplary image reconstruction algorithms may include a simultaneous acquisition of spatial harmonic (SMASH) algorithm, an AUTO-SMASH algorithm, a variable density AUTO-SMASH algorithm, a generalized autocalibrating partially parallel acquisition (GRAPPA) algorithm, a generalized-SMASH algorithm, sensitivity profiles from an array of coils for encoding and reconstruction in a parallel (SPACE RIP) algorithm, sensitivity encoding (SENSE) algorithm, a parallel imaging with localized sensitivities (PILS) algorithm, a modified sensitivity encoding (MSENSE) algorithm, a SPACE RIP algorithm, or the like, or a combination thereof.

The storage module 240 may store data. In some embodiments, the storage module 240 may store data obtained from, such as the acquisition module 210, the determination module 220 and/or the reconstruction module 230. For example, the storage module 240 may store one or more scanning parameters. As another example, the storage module 240 may store a relationship between first flip angles of a plurality of first fat suppression RF pulses, second flip angles of a plurality of second fact suppression RF pulses, and reference flip angles of a plurality of reference fat suppression RF pulses. The relationship may be in the form of a table (e.g., a look-up table), a drawing, a mathematical expression, etc.

It should be noted that the above description of the processor 122 is merely provided for illustration, and not intended to limit the scope of the present disclosure. For persons having ordinary skills in the art, multiple variations and modifications may be made under the teaching of the present invention. However, those variations and modifications do not depart from the scope of the present disclosure. In some embodiments, one or more components of the processor 122 may be omitted. For example, the reconstruction module 230 and/or the storage module 240 may be omitted.

Figure 3:
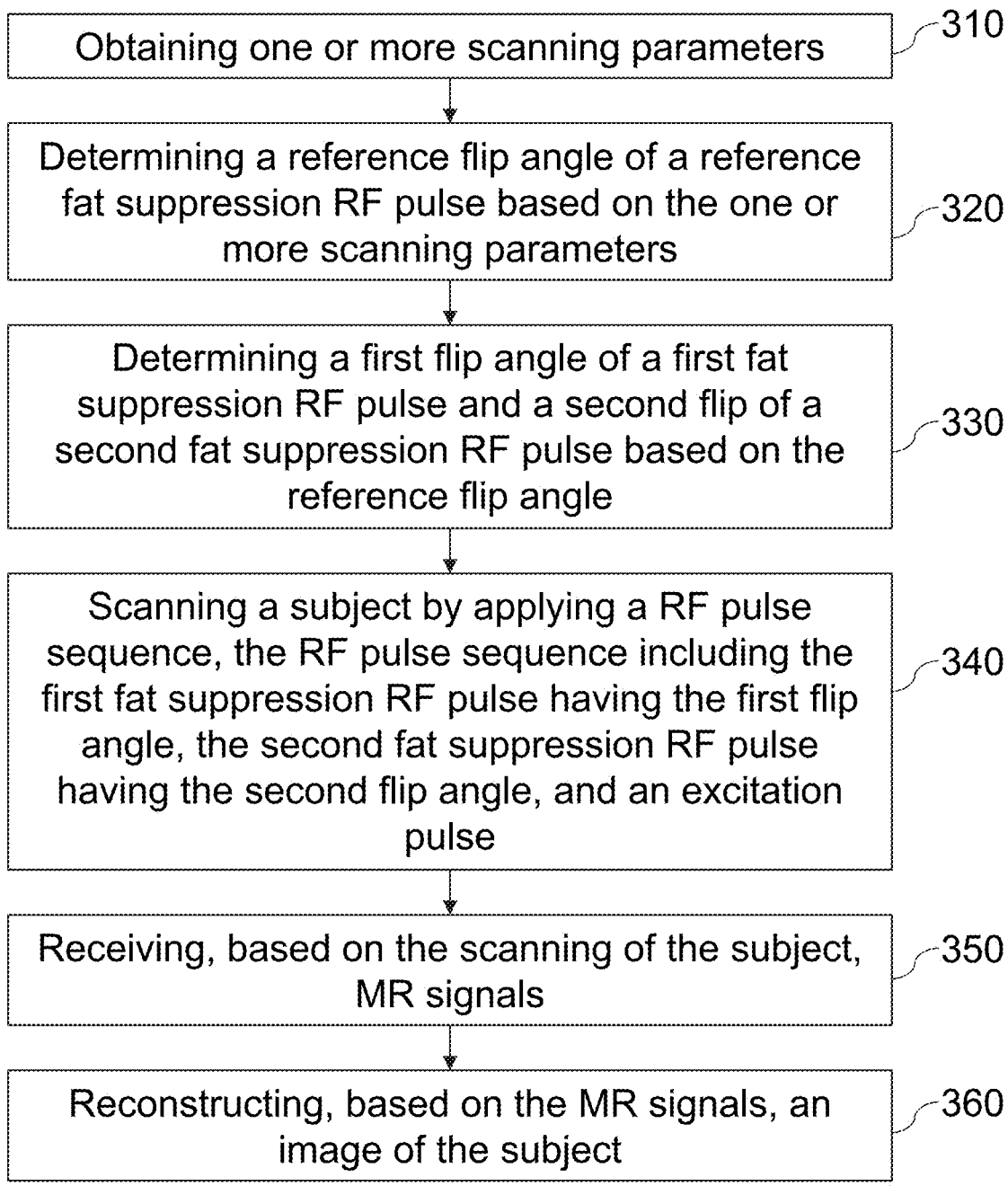
FIG. 3 is a flowchart illustrating an exemplary process for reconstructing an MR image according to some embodiments of the present disclosure.

FIG. 3 is a flowchart illustrating an exemplary process for reconstructing an MR image according to some embodiments of the present disclosure. In some embodiments, process 300 may be implemented in the MRI system 100 illustrated in FIG. 1. For example, the process 300 may be stored in the storage device (e.g., the storage device 125 and/or the storage module 240) in the form of instructions, and invoked and/or executed by the processor 122.

In 310, the acquisition module 210 may obtain one or more scanning parameters. In some embodiments, the scanning parameters may be related to a reference fat suppression RF pulse. The reference fat suppression RF pulse may be applied in MRI to suppress signals from the fat of a subject (or a portion thereof). However, the reference fat suppression RF pulse may be sensitive to the B1 inhomogeneity, which may cause brightness inhomogeneous in an image reconstructed based on the reference fat suppression RF pulse. An improved fat suppression technique (e.g., a combined fat suppression RF pulse as described elsewhere in this disclosure) may be determined based on the reference fat suppression RF pulse to reduce the effect of the B1 inhomogeneity.

During an MR scan, the MRI scanner 10 may apply an RF pulse sequence on the subject (or a portion thereof). The RF pulse sequence may include one or more reference fat suppression RF pulses and one or more excitation RF pulses. The one or more reference fat suppression RF pulses may be configured to suppress fat signals, and the one or more excitation RF pulses may be configured to generate MR signals for image construction. In some embodiments, the MRI scanner 10 may apply a reference fat suppression RF pulse before one or more excitation RF pulses. For example, the RF pulse sequence may include a first reference fat suppression RF pulse, a first excitation RF pulse, a second reference fat suppression RF pulse, a second excitation RF pulse, . . . , a $N^{th}$ reference fat suppression RF pulse, and a $N^{th}$ excitation RF pulse. The MRI scanner 10 may apply a slice-select gradient (Gss) with the first excitation RF pulse to scan the first slice of the subject, a Gss with the second excitation RF pulse to scan the second slice of the subject, . . . , and a Gss with the $N^{th}$ excitation RF pulse to scan the $N^{th}$ slice of the subject. In some embodiments, during a scan of an $M^{th}$ slice, the MRI scanner 10 may further apply one or more excitation RF pulses other than the $M^{th}$ excitation RF pulse 402 on the subject. In some embodiments, the MRI scanner 10 may apply a dephasing gradient after (or immediately after) applying a reference fat suppression RF pulse to dephase the transverse fat magnetization, and thereby avoiding image artifacts. In some embodiments, the MRI scanner 10 may apply a reference fat suppression RF pulse, a dephasing gradient, and an excitation RF pulse with a Gss in sequence. The reference fat suppression RF pulse, the dephasing gradient, or the excitation RF pulse with a Gss may last for a period. The period may be any positive value. For example, the reference fat suppression RF pulse may last for 10 milliseconds. The dephasing gradient may last for 2 milliseconds. The excitation RF pulse with a Gss may last for 3 milliseconds or 4 milliseconds.

In some embodiments, the scanning parameters may include a repetition time of the reference fat suppression RF pulse, a longitudinal recovery time of fat, a time interval between a peak of the reference fat suppression RF pulse and a peak of an excitation RF pulse, and/or an amount of residual fat.

The repetition time of the reference fat suppression RF pulse may refer to a time interval between applying two adjacent reference fat suppression RF pulses in the RF pulse sequence. The longitudinal recovery time of fat may be 260 milliseconds in a 1.5 T MRI and 380 milliseconds in a 3 T MRI. The time interval between a peak of the reference fat suppression RF pulse and a peak of an excitation RF pulse may refer to the time interval between the peaks of two adjacent fat suppression RF pulse and excitation RF pulse. The amount of residual fat may refer to a specific gravity of low-frequency fat. Fat is a compound and has a plurality of peaks in its MR spectroscopy spectrum, including a domain peak and one or more minor peaks. The reference fat suppression RF pulse may only account for the domain peak and the minor peaks whose frequencies are close to the domain peak, while the other minor peaks are neglected. The frequency of the domain peak is about 3.4 ppm lower than that of water, and the component of the fat corresponding to the domain peak is referred to herein as low-frequency fat. The frequency of one or more minor peaks is about 0.6 ppm higher than that of water, and the component of the fat corresponding to the one or more minor peaks is referred to herein as high-frequency fat. The specific gravity of low-frequency fat may refer to a ratio of MR signals of low frequency fat to MR signals of total fat (including low-frequency fat and high-frequency fat). The specific gravity of the low-frequency fat may be close to 1, and the specific gravity of the high-frequency fat may be close to 0.1. The low-frequency fat may be suppressed by the reference fat suppression RF pulse, and its specific gravity may be reduced. In some embodiments, the reduced specific gravity of the low-frequency fat may range from −0.1 to 0 so the amount of residual fat r may range from −0.1 to 0.

In some embodiments, the signal intensity of fat or the brightness of fat in an MR image may be associated with the total amount of residual fat (including the high-frequency fat and the low-frequency fat). For example, the fat in an MR image may be in black if the total amount of residual fat (including high-frequency fat and low-frequency fat) is 0. The desirable total amount of residual fat (including high-frequency fat and low-frequency fat) may be greater than 0 so that the fat in the MR image may be more visible. For example, the desirable total amount of residual fat (including high-frequency fat and low-frequency fat) may be greater than 0.04. In some embodiments, the processor 122 (e.g., the determination module 220) may determine one or more suitable parameters related to a fat suppression technique (e.g., a flip angle of a fat suppression RF pulse, a gradient strength of a dephasing gradient), so that the total amount of residual fat (including high-frequency fat and low-frequency fat) may be greater than 0.

In 320, the determination module 220 may determine a reference flip angle of the reference fat suppression RF pulse based on the one or more scanning parameters. In some embodiments, the reference flip angle may be determined according to Equation (1) below:

$$\alpha = \cos^{-1}\left(\frac{(1-r) - E_\tau}{E_{Tf}(1-r) - E_\tau}\right), \quad \text{Equation (1)}$$

where α refers to the reference flip angle, r refers to the amount of residual fat, $T_f$ refers to the repetition time of the reference fat suppression RF pulse, and τ refers to the time interval between a peak of the reference fat suppression RF pulse and a peak of the excitation RF pulse. $E_\tau$ and $E_{Tf}$ may be determined according to Equations (2) and (3), respectively:

$$E_\tau = \exp\left(-\frac{\tau}{T_1}\right), \quad \text{Equation (2)}$$

$$E_{Tf} = \exp\left(-\frac{T_f}{T_1}\right), \quad \text{Equation (3)}$$

where $T_1$ refers to the longitudinal recovery time of fat.

In 330, the determination module 220 may determine a first flip angle of a first fat suppression RF pulse and a second flip angle of a second fat suppression RF pulse based on the reference flip angle of the reference fat suppression RF pulse. The first fat suppression RF pulse may be applied in combination with the second fat suppression RF pulse to suppress fat signals. For brevity, the combined first and second fat suppression RF pulses may be referred to as a combined fat suppression RF pulse. The effect of the combined fat suppression RF pulses on fat may be substantially similar to that of the reference fat suppression RF pulse. For example, the combined fat suppression RF pulses and the reference fat suppression RF pulse may have a substantially similar effect on the longitudinal magnetic moment of fat. Compared to the reference fat suppression RF pulse, the combined fat suppression RF pulses may have a lower sensitivity to the B1 inhomogeneity, which may, in turn, improve the consistency and effectiveness of fat suppression. As used herein, the B1 inhomogeneity may refer to the inhomogeneity in the spatial distribution of the RF field.

In some embodiments, the determination module 220 may determine a relationship between first flip angles of a plurality of first fat suppression RF pulses and second flip angles of a plurality of second fact suppression RF pulses based on the reference flip angle. The determination module 220 may also determine the first flip angle and the second flip angle based on the determined relationship. The relationship between first flip angles of a plurality of first fat suppression RF pulses and second flip angles of a plurality of second fact suppression RF pulses may be determined according to Equation (4) below:

$$\cos(\alpha_1)\cos(\alpha_2) = \cos(\alpha) \quad \text{Equation (4)},$$

where $\alpha_1$ refers to the first flip angle, $\alpha_2$ refers to the second flip angle, $\cos(\alpha_1)\cos(\alpha_2)$ may represent the effect of the combined first and second fat suppression RF pulses on the longitudinal magnetic moment of fat, and $\cos(\alpha)$ may represent the effect of the reference fat suppression RF pulse on the longitudinal magnetic moment of fat.

The determination module 220 may determine the relationship according to Equation (4) without considering the duration of the first fat suppression RF pulse, the duration of the second fat suppression RF pulse, and the duration of one or more dephasing gradients (if any). The first and second fat suppression RF pulses and the one or more dephasing gradients (if any) may last for a very short time compared to the longitudinal recovery time of fat. Accordingly, the durations of the first and second fat suppression RF pulses and one or more dephasing gradients (if any) may be neglected to simplify the determination of the relationship between first flip angles of a plurality of first fat suppression RF pulses and second flip angles of a plurality of second fact suppression RF pulses. It should be noted that the above example is merely provided for illustration and not intended to limit the scope of the present disclosure. The determination module 220 may determine the relationship based on at least one of the duration of the first fat suppression RF pulse, the duration of the second fat suppression RF pulse, or the duration of the one or more dephasing gradients (if any).

The determination module 220 may determine the first flip angle and the second flip angle based on the determined relationship between first flip angles of a plurality of first fat suppression RF pulses and second flip angles of a plurality of second fact suppression RF pulses according to Equation (5) below:

$$\left.\frac{\partial(\cos(\lambda\alpha_1)\cos(\lambda\alpha_2))}{\partial\lambda}\right|_{\lambda=1} = \quad \text{Equation (5)}$$
$$\alpha_1 \sin(\alpha_1) \cos(\alpha_2) + \alpha_2 \cos(\alpha_1) \sin(\alpha_2) = 0,$$

where λ refers to the B1 inhomogeneity, $$\left.\frac{\partial(\cos(\lambda\alpha_1)\cos(\lambda\alpha_2))}{\partial\lambda}\right|_{\lambda=1}$$

represents the change of $\cos(\alpha_1) \sin(\alpha_2)$ with respect to the B1 inhomogeneity. If the RF field is distributed non-uniformly and its field strength is higher than a threshold (e.g., a default value or a value set by a user), the B1 inhomogeneity λ may be greater than 1. For example, the B1 inhomogeneity may be 1.5 when the field strength is 50% higher than the threshold. If the RF field is distributed non-uniformly and its field strength is lower than a threshold (e.g., a default value or a value set by a user), the B1 inhomogeneity λ may be less than 1. For example, the B1 inhomogeneity may be 0.6 when the field strength is 40% lower than the threshold. If the RF field is distributed uniformly and its field strength is equal to a threshold (e.g., a default value or a value set by a user), the B1 inhomogeneity λ may be equal to 1.

In some embodiments, the determination module 220 may determine the first flip angle and the second flip angle according to Equations (4) and (5). Additionally or alternatively, the determination module 220 may determine a plurality of sets of flip angles based on the relationship between first flip angles of a plurality of first fat suppression RF pulses and second flip angles of a plurality of second fact suppression RF pulses (expressed by, such as the Equation (4)). Each set of flip angles may include a candidate first flip angle and a candidate second flip angle. The determination module 220 may then select a set of flip angles that are the least sensitive to B1 inhomogeneity among the plurality of sets of flip angles according to, for example, Equation (5). The determination module 220 may designate the candidate first flip angle of the selected set as the first flip angle of the first fat suppression RF pulse. The determination module 220 may designate may also designate the candidate second flip angle of the selected set as the second flip angle of the second fat suppression RF pulse. In some embodiments, the determination module 220 may further save the relationship between the determined first flip angle, the determined second flip angle, and the corresponding reference flip angle into the one or more storage devices (e.g., the storage device 125 and/or the storage module 240).

In some embodiments, the determined first flip angle may be greater than 90 degrees, and the determined second flip angle may be less than 90 degrees. Alternatively, the first flip angle may be less than 90 degrees, and the second flip angle may be greater than 90 degrees.

In 340, the MRI scanner 10 may scan a subject by applying an RF pulse sequence. The RF pulse sequence may include the first fat suppression RF pulse having the first flip angle, the second fat suppression RF pulse having the second flip angle, and an excitation RF pulse. The first fat suppression RF pulse and the second fat suppression RF pulse may be configured to suppress fat signals. The excitation RF pulse may be configured to generate MR signals for image construction.

In some embodiments, the processor 122 (e.g., a transmission module not shown in figures) may transmit the determined first flip angle and the second flip angle to the control unit 111. The control unit 111 may control the RF pulse generator 116 to transmit the first fat suppression RF pulse having the first flip angle, the second fat suppression RF pulse having the second flip angle, and the excitation RF pulse in sequence. In some embodiments, the RF pulse generator 116 may apply the second fat suppression RF pulse having the second flip angle after (or immediately after) the first fat suppression RF pulse having the first flip angle.

In some embodiments, the control unit 111 may control the gradient generator 112 to apply a dephasing gradient after applying the first fat suppression RF pulse and/or the second fat suppression RF pulse, in order to dephase the transverse fat magnetization and avoid image artifacts. The dephasing gradient may be applied along at least one of the X-axis, the Y-axis, or the Z-axis. In some embodiments, the gradient strength of the dephasing gradient may be greater than 24000 mT·us.

In some embodiments, the gradient generator 112 may apply a first dephasing gradient after the first fat suppression RF pulse. Additionally or alternatively, the gradient generator 112 may apply a second dephasing gradient after the second fat suppression RF pulse. The gradient strength and/or the directions of the first and second dephasing gradient may be same or different. In some embodiments, the gradient generator 112 may apply the second dephasing gradient after (or immediately after) the first dephasing gradient.

In 350, the MRI scanner 10 (e.g., the RF pulse receiver 118) may receive MR signals based on the scanning of the subject.

In 360, the reconstruction module 230 and/or the reconstruction unit 121 may reconstruct an image of the subject based on the MR signals. In some embodiments, the reconstruction module 230 and/or the reconstruction unit 121 may reconstruct the image according to an image reconstruction algorithm. Exemplary image reconstruction algorithms may include a simultaneous acquisition of spatial harmonic (SMASH) algorithm, an AUTO-SMASH algorithm, a variable density AUTO-SMASH algorithm, a generalized auto-calibrating partially parallel acquisition (GRAPPA) algorithm, a generalized-SMASH algorithm, sensitivity profiles from an array of coils for encoding and reconstruction in a parallel (SPACE RIP) algorithm, sensitivity encoding (SENSE) algorithm, a parallel imaging with localized sensitivities (PILS) algorithm, a modified sensitivity encoding (MSENSE) algorithm, a SPACE RIP algorithm, or the like, or a combination thereof.

In some embodiments, in 330, the determination module 220 may determine the first flip angle of the first fat suppression RF pulse and the second flip angle of the second fat suppression RF pulse based on a relationship between first flip angles of a plurality of first fat suppression RF pulses, second flip angles of a plurality of second fact suppression RF pulses, and reference flip angles of a plurality of reference fat suppression RF pulses. The relationship may be in the form of a table, a drawing, a mathematical expression, etc. The determination module 220 may retrieve the relationship from a storage device (e.g., the storage device 125 and/or the storage module 240) and determine a set of first flip angle and second flip angle corresponding to a reference flip angle based on the retrieved relationship. For example, the relationship may be recorded in a table of reference flip angles and their corresponding sets of first flip angle and second flip angle (e.g., a look-up table). The determination module 220 may determine the set of first flip angle and second flip angle corresponding to the reference flip angle by searching the table.

In some embodiments, 320 and 330 may be integrated into a single step. The processor 122 may determine the first flip angle of the first fat suppression RF pulse and the second flip angle of the second fat suppression RF pulse directly based on the one or more scanning parameters acquired in 310. For example, the determination module 220 may determine a relationship between first flip angles of a plurality of first fat suppression RF pulses and second flip angles of a plurality of second fact suppression RF pulses based on the scanning parameters according to Equation (6) below:

$$\cos(\alpha_1)\cos(\alpha_2) = \cos\left(\cos^{-1}\left(\frac{(1-r)-E_\tau}{E_{Tf}(1-r)-E_\tau}\right)\right) \quad \text{Equation (6)}$$

The determination module 220 may also determine the first flip angle and the second flip angle based on the determined relationship according to, such as Equation (5) as described in connection with 330. In some embodiments, the determination module 220 may determine the first flip angle of the first fat suppression RF pulse and the second flip angle of the second fat suppression RF pulse based on a relationship between first flip angles of a plurality of first fat suppression RF pulses, second flip angles of a plurality of second fact suppression RF pulses, and scanning parameters. The relationship may be in the form of a table, a drawing, a mathematical expression, etc. The determination module 220 may retrieve the relationship from a storage device (e.g., the storage device 125 and/or the storage module 240) and determine a set of first flip angle and second flip angle corresponding to a set of scanning parameters based on the retrieved relationship.

It should be noted that the above description of the process 300 is merely provided for illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 4:
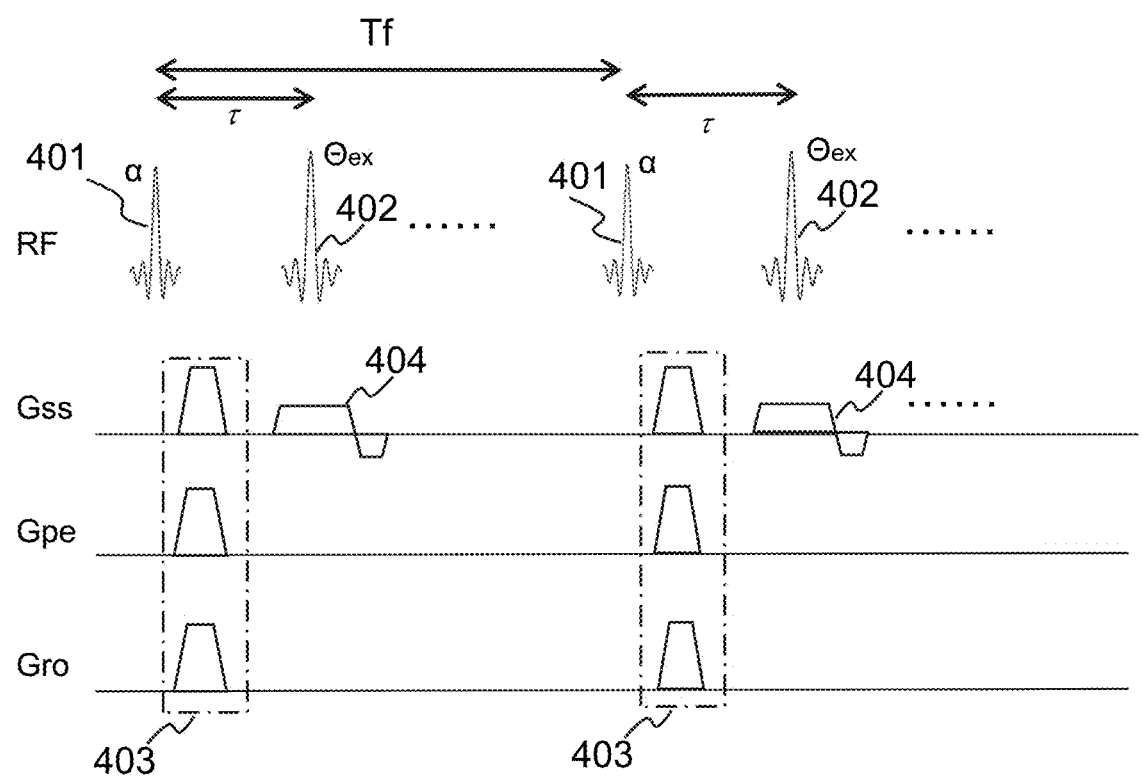
FIG. 4 is a schematic diagram illustrating an exemplary RF pulse sequence according to some embodiments of the present disclosure.

FIG. 4 is a schematic diagram illustrating an exemplary RF pulse sequence 400 according to some embodiments of the present disclosure. The RF pulse sequence 400 may include one or more reference fat suppression RF pulses 401 and one or more excitation RF pulses 402. The reference fat suppression RF pulse 401 may have a reference flip angle α and the excitation RF pulse 402 may have an excitation flip angle Θex. The time interval between two adjacent reference fat suppression RF pulses 401 in the RF pulse sequence 400 may be referred to as the repetition time of the reference fat suppression RF pulse denoted as $T_f$. The time interval between the peaks of two adjacent fat suppression RF pulse 401 and excitation RF pulse 402 may be denoted as τ.

In some embodiments, the MRI scanner 10 may scan a subject by applying the RF pulse sequence 400. The MRI scanner 10 may apply a Gss 404 with an excitation RF pulse 402 to scan a certain slice of the subject. During the scanning of the slice, the MRI scanner 10 may also apply one or more excitation RF pulses other than the excitation RF pulse 402 on the subject. Additionally or alternatively, the MRI scanner 10 may apply a dephasing gradient 403 after (or immediately after) a reference fat suppression RF pulse 401 to dephase the transverse fat magnetization.

Figure 5:
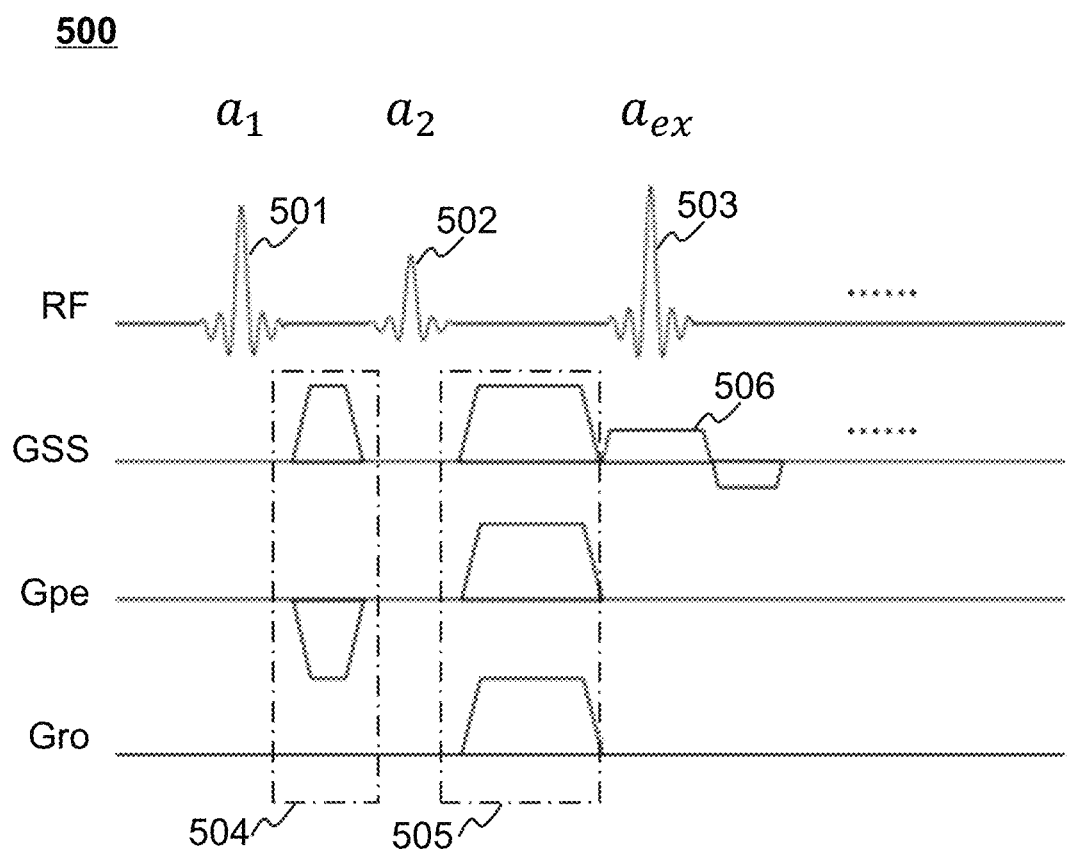
FIG. 5 is a schematic diagram illustrating an exemplary RF pulse sequence according to some embodiments of the present disclosure.

FIG. 5 is a schematic diagram illustrating an exemplary RF pulse sequence 500 according to some embodiments of the present disclosure. The RF pulse sequence 500 may include a first fat suppression RF pulse 501 having a first flip angle $α_1$, a second fat suppression RF pulse 502 having a second flip angle $α_2$, and an excitation RF pulse 503 having an excitation flip angle $α_{ex}$. In some embodiments, the first flip angle $α_1$ and the second flip angle $α_2$ may be determined based on a reference flip angle of a reference fat suppression RF pulse as described in connection with step 330.

In some embodiments, the MRI scanner 10 may scan a subject by applying the RF pulse sequence 500. The MRI scanner 10 may apply a Gss 506 with the excitation RF pulse 503 to scan a certain slice of the subject. Additionally or alternatively, the MRI scanner 10 may apply a first dephasing gradient 504 after the first fat suppression RF pulse 501. The MRI scanner 10 may also apply a second dephasing gradient 505 after the second fat suppression RF pulse 502. The gradient strength and/or the directions of the first dephasing gradient 504 and the second dephasing gradient 505 may be the same or different.

It should be noted that the above descriptions regarding the RF pulse sequence 400 and/or the RF pulse sequence 500 merely provided for illustration, and not intended to limit the scope of the present disclosure. For persons having ordinary skills in the art, multiple variations and modifications may be made under the teaching of the present invention. However, those variations and modifications do not depart from the scope of the present disclosure. For example, the MRI scanner 10 may apply the RF pulse sequence 500 without applying the first dephasing gradient 504 or the second dephasing gradient 505.

Figure 6:
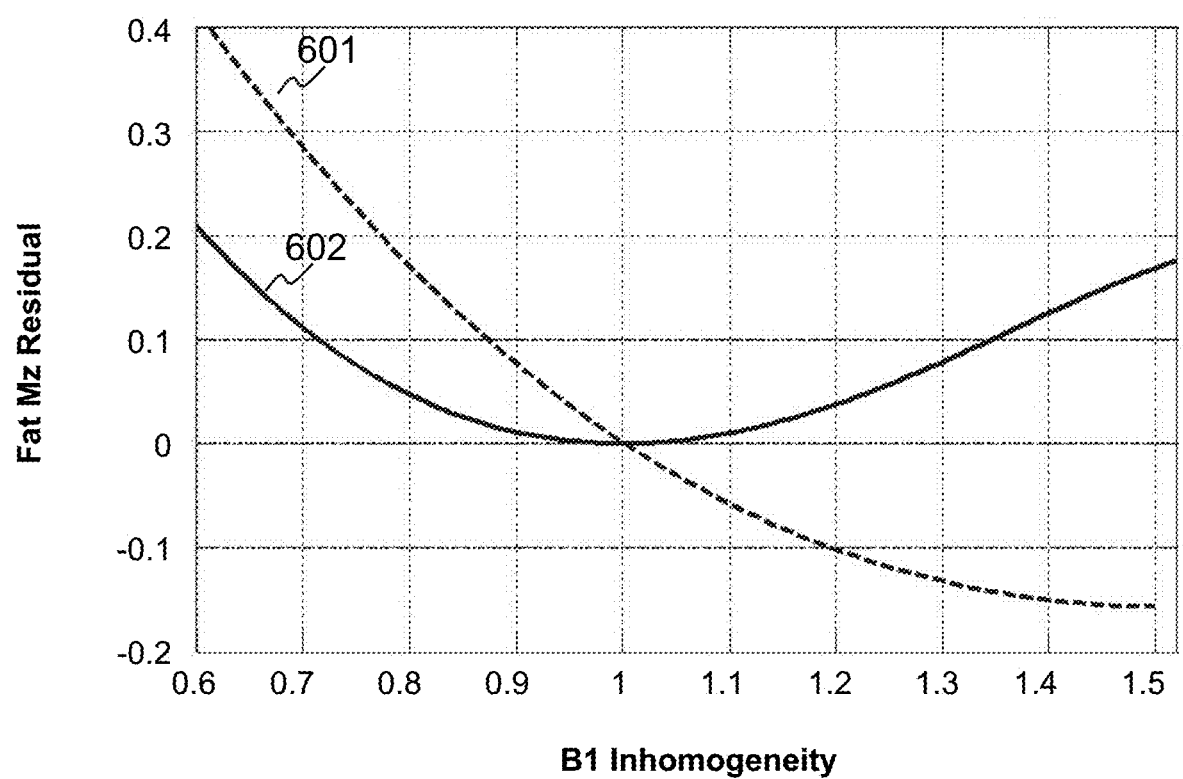
FIG. 6 is a schematic diagram illustrating an exemplary sensitivity of fat suppression RF pulse with respect to the B1 inhomogeneity according to some embodiments of the present disclosure.

FIG. 6 is a schematic diagram illustrating an exemplary sensitivity of fat suppression RF pulse with respect to the B1 inhomogeneity according to some embodiments of the present disclosure. The sensitivity of fat suppression RF pulse with respect to the B1 inhomogeneity illustrated in FIG. 6 is measured in a 1.5 T MRI system when the repetition time of the fat suppression RF pulse is 255 milliseconds, the total scanning time is 2700 milliseconds, and the number of slices is 12. The longitudinal recovery time of fat is supposed to be 260 milliseconds in the 1.5 T MRI system.

The horizontal axis in FIG. 6 corresponds to the B1 inhomogeneity. The vertical axis corresponds to a residual longitudinal magnetic moment of fat (including low-frequency fat and high-frequency fat). The residual longitudinal magnetic moment of fat may indicate the effectiveness of the fat suppression RF pulse on the fat. Curve 601 indicates an effect of a reference fat suppression RF pulse on the residual longitudinal magnetic moment of fat. Curve 602 indicates an effect of a combined fat suppression RF pulse on the residual longitudinal magnetic moment of fat. The combined fat suppression RF pulse may include a first fat suppression RF pulse having a first flip angle and a second fat suppression RF pulse having a second flip angle as described elsewhere in this disclosure (e.g., FIG. 3 and the relevant descriptions thereof).

The curve 602 corresponding to the combined fat suppression RF pulse is flatter than the curve 601 corresponding to the reference fat suppression RF pulse as illustrated in FIG. 6. For example, in the curve 601, the residual longitudinal magnetic moment of fat changes from 0% to 5% when the B1 inhomogeneity changes from −7% to 0%. In the curve 602, the residual longitudinal magnetic moment of fat changes from 0% to 5% when the B1 inhomogeneity changes from −21% to 24%. On the other hand, in the curve 602, the residual longitudinal magnetic moment of fat is equal to or greater than 0 when the B1 inhomogeneity changes. In the curve 601, the residual longitudinal magnetic moment of fat changes from positive values to negative values when the B1 inhomogeneity changes. The reference fat suppression RF pulse is more sensitive to the B1 inhomogeneity than the combined fat suppression RF pulse. An image reconstructed based on the reference fat suppression RF pulse may be more likely to have brightness inhomogeneity than an image based on the combined fat suppression RF pulse.

Figure 7:
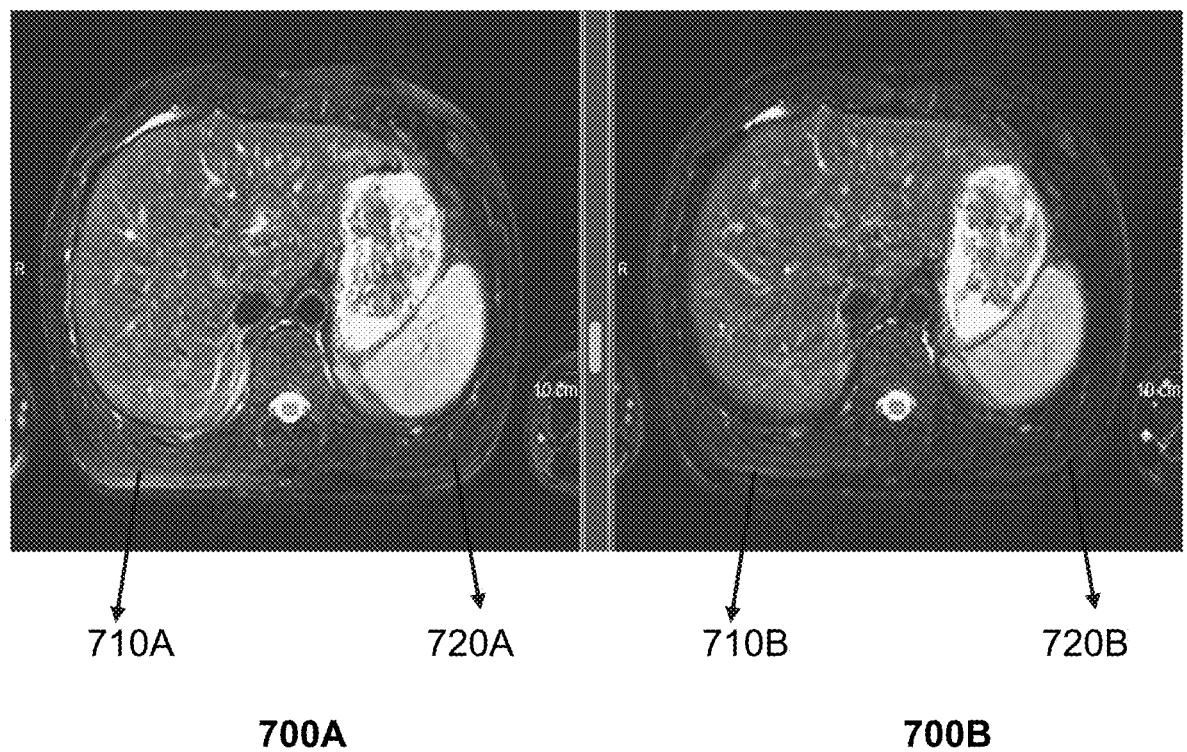
FIG. 7 illustrates exemplary images of an abdomen according to some embodiments of the present disclosure.

FIG. 7 illustrates exemplary images 700A and 700B of an abdomen according to some embodiments of the present disclosure. The images 700A and 700B are generated in a 1.5 T MRI system. The image 700A is generated based on a reference fat suppression RF pulse as described elsewhere in this disclosure (e.g., step 310 and the relevant descriptions). The image 700B is generated based on a combined fat suppression RF pulse as described elsewhere in this disclosure (e.g., steps 330 and 340, and the relevant descriptions).

As illustrated in FIG. 7, the brightness of fat in the image 700B is more homogeneous than that in the image 700A. For example, the brightness of fat in the regions in the regions 710B and 720B is more homogeneous than that in their corresponding regions (i.e., 710A and 720A) in the image 700A.

Figure 8:
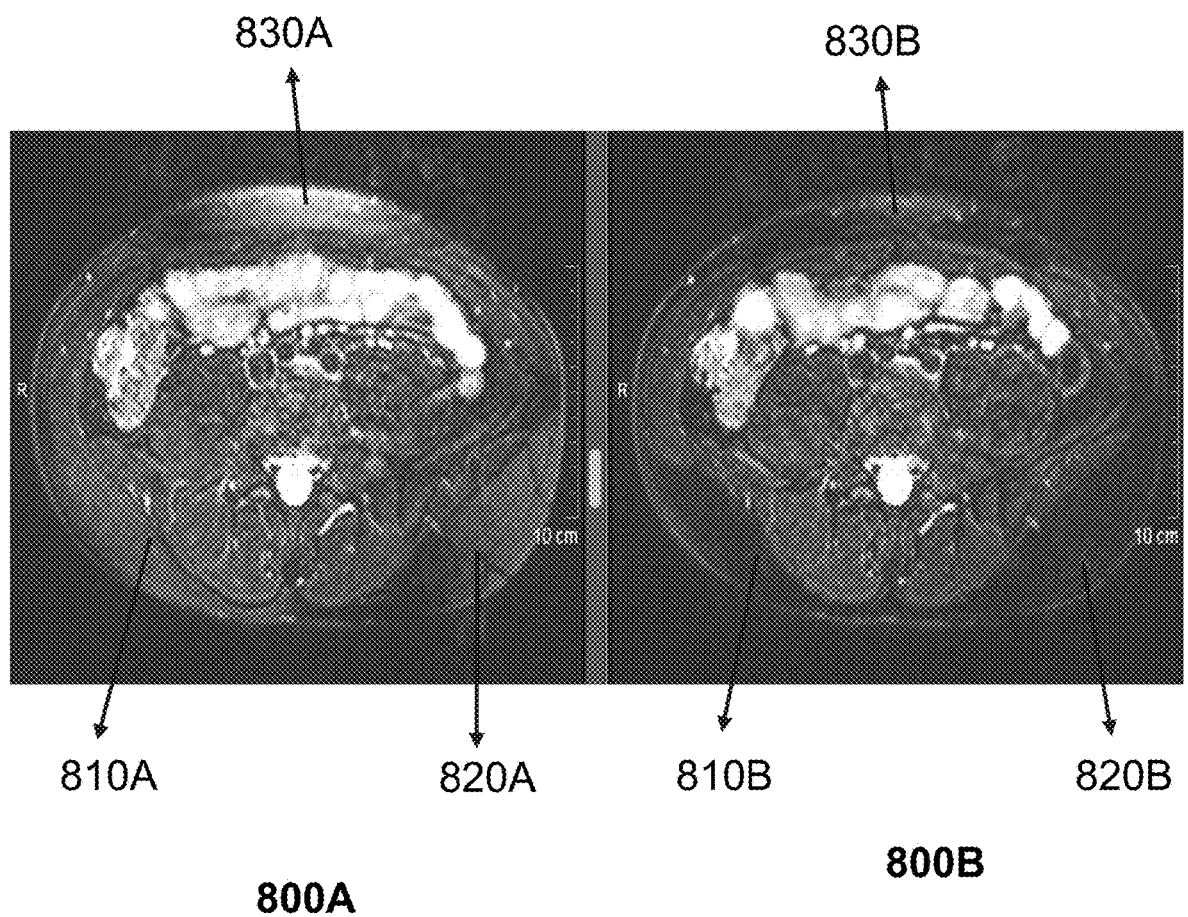
FIG. 8 illustrates exemplary images of a pelvic cavity according to some embodiments of the present disclosure.

FIG. 8 illustrates exemplary images 800A and 800B of a pelvic cavity according to some embodiments of the present disclosure. The images 800A and 800B are generated in a 1.5 T MRI system. The image 800A is generated based on a reference fat suppression RF pulse as described elsewhere in this disclosure (e.g., step 310 and the relevant descriptions). The image 800B is generated based on a combined fat suppression RF pulse as described elsewhere in this disclosure (e.g., steps 330, and 340 and the relevant descriptions).

As illustrated in FIG. 8, the brightness of fat in the image 800B is more homogeneous than that in the image 800A. For example, the brightness of fat in the regions 810B, 820B and 830B is more homogeneous than that in their corresponding regions (i.e., 810A, 820A and 830A) in the image 800A.

Figure 9:
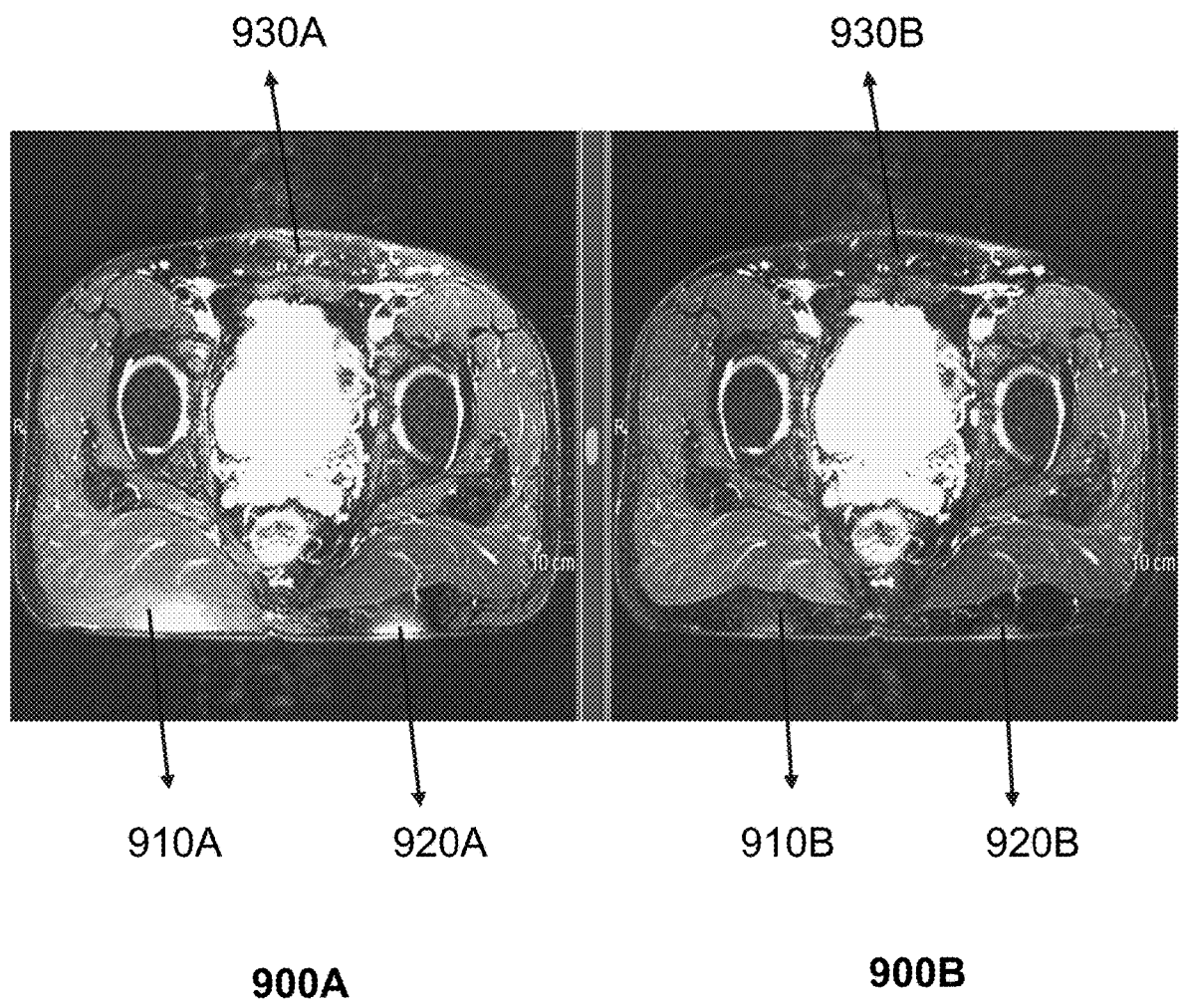
FIG. 9 illustrates exemplary images of a hip joint according to some embodiments of the present disclosure.

FIG. 9 illustrates exemplary images 900A and 900B of a hip joint according to some embodiments of the present disclosure. The images 900A and 900B are generated in a 3 T MRI system. The image 900A is generated based on a reference fat suppression RF pulse as described elsewhere in this disclosure (e.g., step 310 and the relevant descriptions). The image 900B is generated based on a combined fat suppression RF pulse as described elsewhere in this disclosure (e.g., steps 330 and 340 and the relevant descriptions).

As illustrated in FIG. 9, the brightness of fat in the image 900B is more homogeneous than that in the image 900A. For example, the brightness of fat in the regions 910B, 920B and 930B is more homogeneous than that in their corresponding regions (i.e., 910A, 920A and 930A) in the image 900A.

Figure 10:
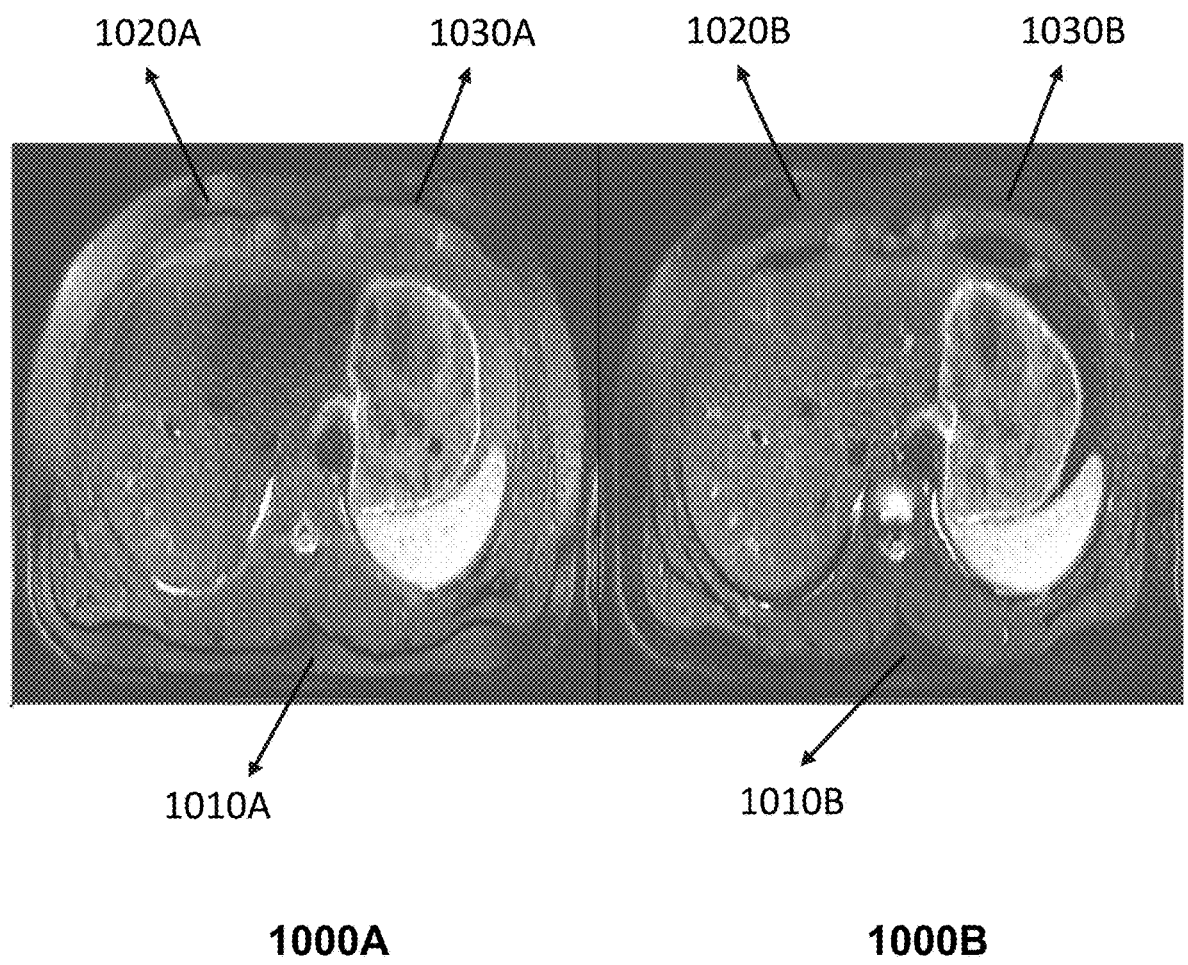
FIG. 10 illustrates exemplary images of an abdomen according to some embodiments of the present disclosure.

FIG. 10 illustrates exemplary images 1000A and 1000B of an abdomen according to some embodiments of the present disclosure. The images 1000A and 10006 are generated in a 1.5 T MRI system. The image 1000A is generated based on a reference fat suppression RF pulse as described elsewhere in this disclosure (e.g., step 310 and the relevant descriptions). The image 1000B is generated based on a combined fat suppression RF pulse as described elsewhere in this disclosure (e.g., steps 330 and 340, and the relevant descriptions).

As illustrated in FIG. 10, the brightness of fat in the image 1000B is more homogeneous than that in the image 1000A. For example, the brightness of fat in the regions 10106, 10206 and 10306 is more homogeneous than that in their corresponding regions (i.e., 1010A, 1020A and 1030A) in the image 1000A.

Figure 11:
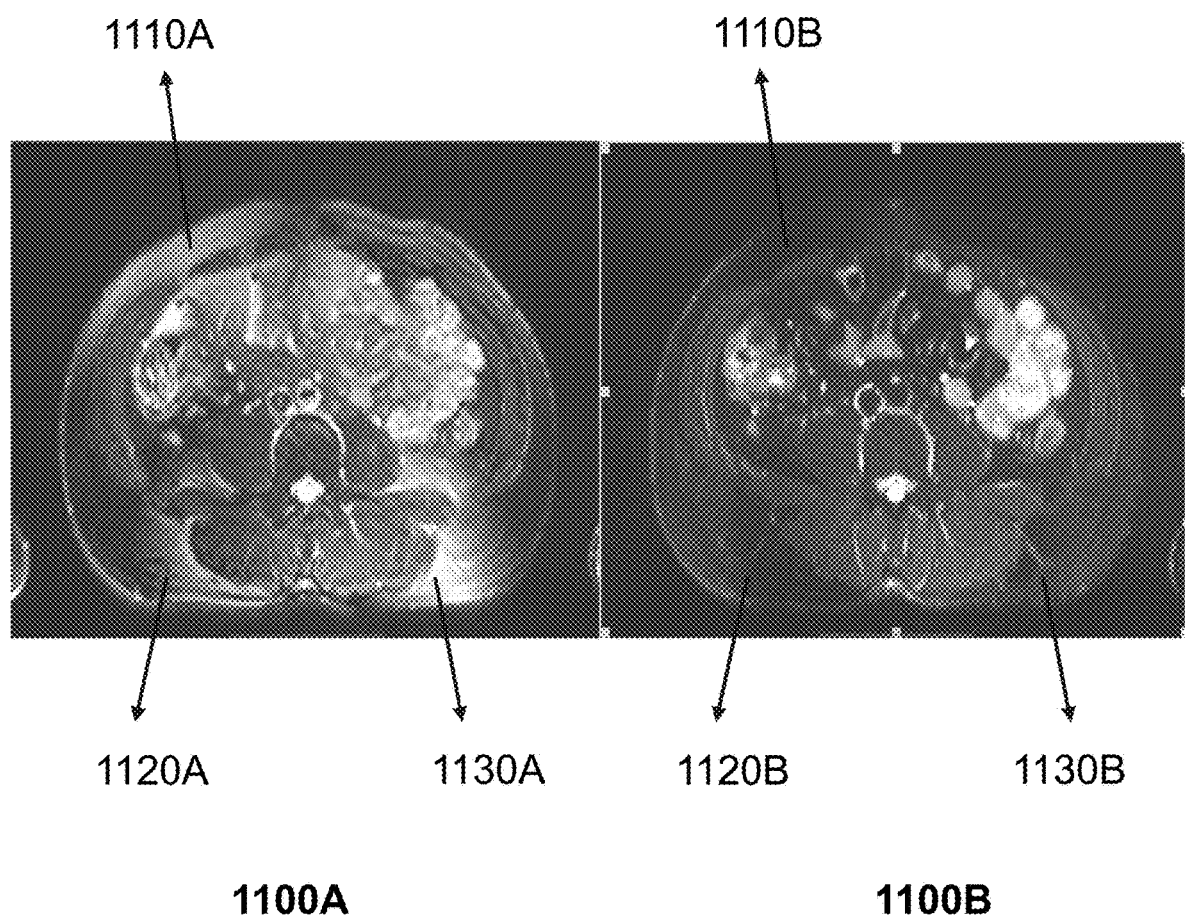
FIG. 11 illustrates exemplary images of a pelvic cavity according to some embodiments of the present disclosure.

FIG. 11 illustrates exemplary images 1100A and 1100B of a pelvic cavity according to some embodiments of the present disclosure. The images 1100A and 1100B are generated in a 1.5 T MRI system. The image 1100A is generated based on a reference fat suppression RF pulse as described elsewhere in this disclosure (e.g., step 311 and the relevant descriptions). The image 1100B is generated based on a combined fat suppression RF pulse as described elsewhere in this disclosure (e.g., steps 330 and 340, and the relevant descriptions).

As illustrated in FIG. 11, the brightness of fat in the image 1100B is more homogeneous than that in the image 1100A. For example, the brightness of fat in the regions 11106, 1120B and 1130B is more homogeneous than that in their corresponding regions (i.e., 1110A, 1120A and 1130A) in the image 1100A.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran, Perl, COBOL, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof to streamline the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A system, comprising:
a Magnetic Resonance Imaging (MRI) scanner;
a storage device storing a set of instructions; and
at least one processor configured to communicate with the storage device, wherein when executing the set of instructions, the at least one processor is configured to direct the system to:
obtain, by the at least one processor, one or more scanning parameters;
determine, by the at least one processor, a reference flip angle of a reference fat suppression RF pulse based on the one or more scanning parameters;
determine, by the at least one processor, a first flip angle of a first fat suppression radio frequency (RF) pulse and a second flip angle of a second fat suppression RF pulse based on the reference flip angle;
scan, by the MRI scanner, a subject by applying an RF pulse sequence without the reference fat suppression RF pulse, the RF pulse sequence including the first fat suppression RF pulse having the first flip angle, the second fat suppression RF pulse having the second flip angle, and an excitation RF pulse;
receive, by the MRI scanner, magnetic resonance (MR) signals based on the scanning of the subject; and
reconstruct, by the at least one processor, an image of the subject based on the MR signals.

2. A method implemented on a computing device having one or more processors and a storage media, the method comprising:
obtaining one or more scanning parameters;
determining, based on the one or more scanning parameters, a reference flip angle of a reference fat suppression RF pulse:
determining a first flip angle of a first fat suppression RF pulse and a second flip angle of a second fat suppression RF pulse based on the reference flip angle:
scanning, by an MRI scanner, a subject by applying an RF pulse sequence without the reference fat suppression RF pulse, the RF pulse sequence including the first fat suppression RF pulse having the first flip angle, the second fat suppression RF pulse having the second flip angle, and an excitation pulse;
receiving, by the MRI scanner, MR signals based on the scanning of the subject; and
reconstructing an image of the subject based on the MR signals.

3. A non-transitory computer-readable storage medium storing instructions that, when executed by at least one processor of a system, cause the system to perform a method, the method comprising:
obtaining one or more scanning parameters;
determining, based on the one or more scanning parameters, a reference flip angle of a reference fat suppression RF pulse;
determining a first flip angle of a first fat suppression RF pulse and a second flip angle of a second fat suppression RF pulse based on the reference flip angle;
scanning, by an MRI scanner, a subject by applying an RF pulse sequence without the reference fat suppression RF pulse, the RF pulse sequence including the first fat suppression RF pulse having the first flip angle, the second fat suppression RF pulse having the second flip angle, and an excitation pulse;
receiving, by the MRI scanner, MR signals based on the scanning of the subject; and
reconstructing an image of the subject based on the MR signals.

4. The system of claim 1, wherein to determine the first flip angle and the second flip angle, the at least one processor is further configured to direct the system to:
determine a relationship between first flip angles of a plurality of first fat suppression RF pulses and second flip angles of a plurality of second fat suppression RF pulses based on the reference flip angle of the reference fat suppression RF pulse; and determine the first flip angle and the second flip angle based on the determined relationship.

5. The system of claim 4, wherein the at least one processor is further configured to direct the system to save a relationship between the determined first flip angle, the determined second flip angle, and a corresponding reference flip angle to the storage device.

6. The system of claim 4, wherein to determine the first flip angle and the second flip angle based on the relationship between first flip angles of a plurality of first fat suppression RF pulses and second flip angles of a plurality of second fat suppression RF pulses, the at least one processor is further configured to direct the system to:

determine a plurality of sets of flip angles based on the relationship between first flip angles of a plurality of first fat suppression RF pulses and second flip angles of a plurality of second fat suppression RF pulses, each of the plurality of set of flip angles including a candidate first flip angle and a candidate second flip angle;

select, among the plurality of sets of flip angles, a set of flip angles that are least sensitive to RF field inhomogeneity;

designate the candidate first flip angle of the selected set as the first flip angle of the first fat suppression RF pulse; and designate the candidate second flip angle of the selected set as the second flip angle of the second fat suppression RF pulse.

7. The system of claim 1, wherein to determine the first flip angle and the second flip angle of the second fat suppression RF pulse, the at least one processor is configured to direct the system to:

obtain, from the storage device, a relationship between first flip angles of a plurality of first fat suppression RF pulses, second flip angles of a plurality of second fat suppression RF pulses, and reference flip angles of a plurality of reference fat suppression RF pulses; and determine the first flip angle of the first fat suppression RF pulse and the second flip angle of the second fat suppression RF pulse based on the obtained relationship.

8. The system of claim 1, wherein the one or more scanning parameters include at least one of: a repetition time of the reference fat suppression RF pulse, a time interval between a peak of the reference fat suppression RF pulse and a peak of the excitation RF pulse, the amount of residual fat, or a longitudinal recovery time of fat.

9. The system of claim 1, wherein the at least one processor is further configured to direct the system to apply, by the MRI scanner, a first dephasing gradient after the first fat suppression RF pulse.

10. The system of claim 9, wherein, the at least one processor is further configured to direct the system to apply, by the MRI scanner, a second dephasing gradient after the second fat suppression RF pulse.

11. The method of claim 2, wherein the determining the first flip angle and the second flip angle further comprising:

determining a relationship between first flip angles of a plurality of first fat suppression RF pulses and second flip angles of a plurality of second fat suppression RF pulses based on the reference flip angle of the reference fat suppression RF pulse; and determining the first flip angle and the second flip angle based on the determined relationship.

12. The method of claim 11, further comprising saving a relationship between the determined first flip angle, the determined second flip angle, and a corresponding reference flip angle to a storage device.

13. The method of claim 11, wherein the determining the first flip angle and the second flip angle based on the relationship between first flip angles of a plurality of first fat suppression RF pulses and second flip angles of a plurality of second fat suppression RF pulses further comprising:

determining a plurality of sets of flip angles based on the relationship between first flip angles of a plurality of first fat suppression RF pulses and second flip angles of a plurality of second fat suppression RF pulses, each of the plurality of set of flip angles including a candidate first flip angle and a candidate second flip angle;

selecting, among the plurality of sets of flip angles, a set of flip angles that are least sensitive to RF field inhomogeneity;

designating the candidate first flip angle of the selected set as the first flip angle of the first fat suppression RF pulse; and designating the candidate second flip angle of the selected set as the second flip angle of the second fat suppression RF pulse.

14. The method of claim 2, wherein the determining the first flip angle and the second flip angle of the second fat suppression RF pulse further comprising:

obtaining, from a storage device, a relationship between first flip angles of a plurality of first fat suppression RF pulses, second flip angles of a plurality of second fat suppression RF pulses, and reference flip angles of a plurality of reference fat suppression RF pulses; and determining the first flip angle of the first fat suppression RF pulse and the second flip angle of the second fat suppression RF pulse based on the obtained relationship.

15. The method of claim 2, wherein the one or more scanning parameters include at least one of: a repetition time of the reference fat suppression RF pulse, a time interval between a peak of the reference fat suppression RF pulse and a peak of the excitation pulse, the amount of residual fat, or a longitudinal recovery time of fat.

16. The method of claim 2, further comprising applying, by the MRI scanner, a first dephasing gradient after the first fat suppression RF pulse.

17. The method of claim 16, further comprising applying a second dephasing gradient after the second fat suppression RF pulse.

* * * * *